(12) United States Patent
Kotani et al.

(10) Patent No.: US 10,566,420 B2
(45) Date of Patent: Feb. 18, 2020

(54) SEMICONDUCTOR DEVICE

(71) Applicant: SHINDENGEN ELECTRIC MANUFACTURING CO., LTD., Tokyo (JP)

(72) Inventors: Ryohei Kotani, Hanno (JP); Toshiki Matsubara, Hanno (JP); Nobutaka Ishizuka, Hanno (JP); Masato Mikawa, Hanno (JP); Hiroshi Oshino, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/543,848

(22) PCT Filed: Sep. 30, 2016

(86) PCT No.: PCT/JP2016/078999
§ 371 (c)(1),
(2) Date: Apr. 5, 2018

(87) PCT Pub. No.: WO2018/061178
PCT Pub. Date: Apr. 5, 2018

(65) Prior Publication Data
US 2018/0331178 A1    Nov. 15, 2018

(51) Int. Cl.
*H01L 29/06* (2006.01)
*H01L 29/739* (2006.01)
(Continued)

(52) U.S. Cl.
CPC ...... *H01L 29/0661* (2013.01); *H01L 27/0255* (2013.01); *H01L 27/0296* (2013.01);
(Continued)

(58) Field of Classification Search
None
See application file for complete search history.

(56) References Cited

U.S. PATENT DOCUMENTS

| 2013/0146941 A1 | 6/2013 | Andou |
| 2016/0079232 A1 | 3/2016 | Shono |
| 2017/0317068 A1* | 11/2017 | Kaneda ................ H01L 21/761 |

FOREIGN PATENT DOCUMENTS

| JP | 06-069423 A | 3/1994 |
| JP | 08-70123 A | 3/1996 |

(Continued)

OTHER PUBLICATIONS

International Search Report dated Dec. 20, 2016, for Application No. PCT/JP2016/078999 (4 pages).

(Continued)

*Primary Examiner* — Thien F Tran
(74) *Attorney, Agent, or Firm* — Nutter McClennen & Fish, LLP

(57) ABSTRACT

A semiconductor device of an embodiment includes an overvoltage protection diode in which an N-type semiconductor layer and a P-type semiconductor layer, formed on an insulating film in a voltage supporting region, are alternately disposed adjacently to each other. The overvoltage protection diode is disposed at a corner portion on the upper face of the insulating film, and extends from the corner portion to the center portion of the semiconductor substrate.

2 Claims, 12 Drawing Sheets

(51) Int. Cl.
  *H01L 29/78* (2006.01)
  *H01L 27/02* (2006.01)
  *H01L 29/866* (2006.01)

(52) U.S. Cl.
  CPC ...... *H01L 29/0619* (2013.01); *H01L 29/0649* (2013.01); *H01L 29/0696* (2013.01); *H01L 29/7395* (2013.01); *H01L 29/7808* (2013.01); *H01L 29/866* (2013.01)

(56) References Cited

FOREIGN PATENT DOCUMENTS

| | | |
|---|---|---|
| JP | 08-172190 A | 7/1996 |
| JP | 11-243200 A | 9/1999 |
| JP | 2001-244463 A | 9/2001 |
| JP | 2005-217152 A | 8/2005 |
| JP | 2013-125757 A | 6/2013 |
| WO | 2014/142331 A1 | 9/2014 |

OTHER PUBLICATIONS

Dutch Search Report for Application No. 2019311, dated Jan. 18, 2018 (14 Pages).
Indian Office Action for Application No. 201717023797, dated Aug. 26, 2019 (6 pages).

\* cited by examiner

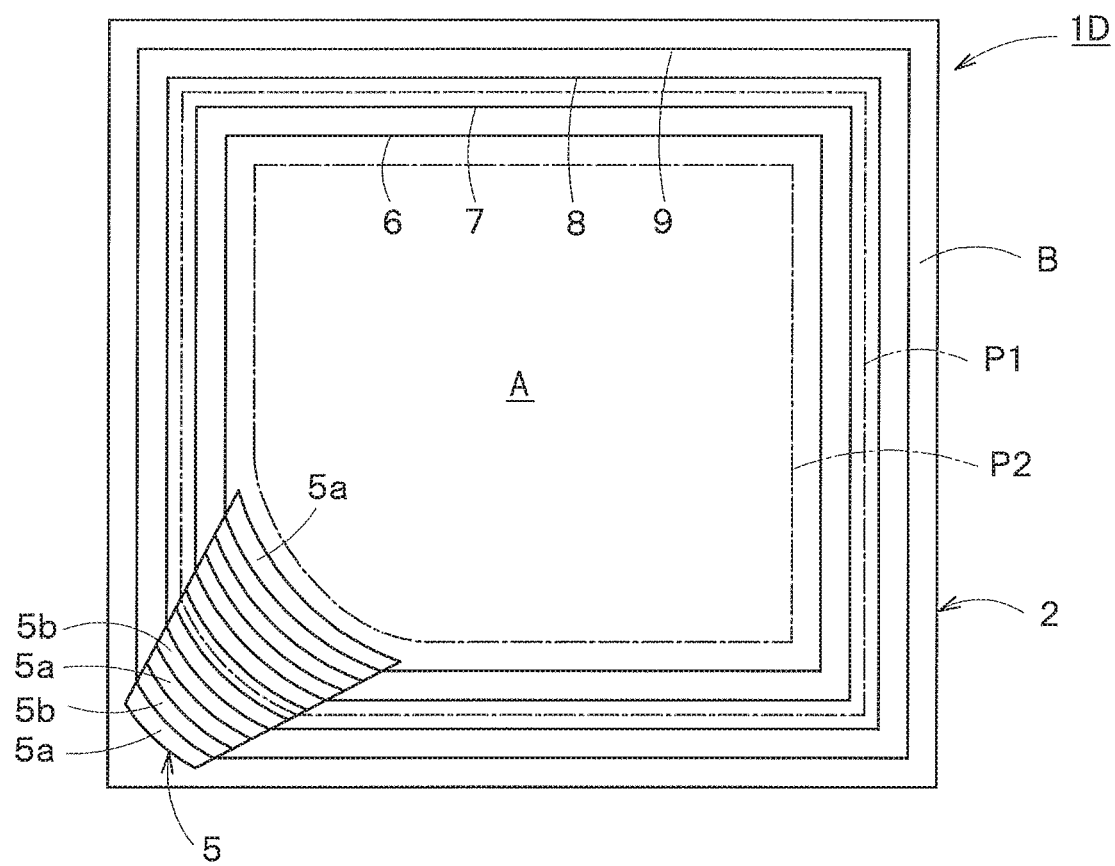
F I G. 9

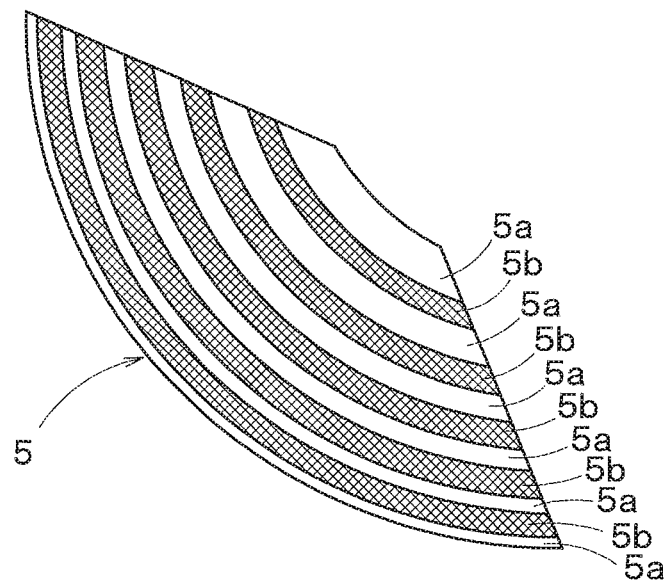
F I G. 16
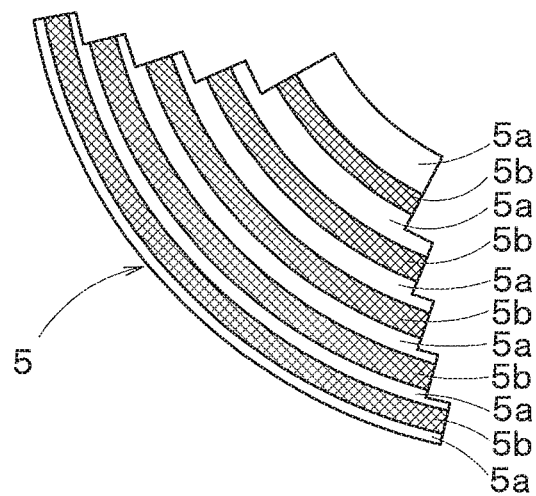
F I G. 17

SEMICONDUCTOR DEVICE

The present application claims priority under 35 U.S.C. § 365 to PCT/JP2016/078999, filed on Sep. 30, 2016, the disclosure of which are incorporated herein by reference.

TECHNICAL FIELD

The present invention relates to a semiconductor device, and in more detail, to a semiconductor device having a MOS (Metal-Oxide-Semiconductor) structure and including an overvoltage protection diode.

BACKGROUND ART

Semiconductor devices having a so-called MOS structure such as an IGBT (Insulated Gate Bipolar Transistor) and a MOSFET (MOS Field Effect Transistor) have been known. In such a MOS type semiconductor device, an overvoltage protection diode configured of Zener diodes connected in series is used as a protective measure against overvoltage. Specifically, the overvoltage protection diode is configured such that an N-type semiconductor layer and a P-type semiconductor layer are alternately arranged adjacently to each other. In the case of an IGBT, an overvoltage protection diode is provided between a collector terminal and a gate terminal or between a gate terminal and an emitter terminal.

In a conventional semiconductor device 100, the top surface of a semiconductor substrate 120 includes an active region A on which main electric current flows, and a voltage supporting region B surrounding the active region A. Further, as illustrated in FIG. 14, an overvoltage protection diode 150 is provided so as to protrude from a side portion to the center portion of the semiconductor substrate 120. Furthermore, the periphery of the semiconductor substrate 120 is provided with conductors (field plates) 160, 170, 180, and 190 made of a conductive material, in order to make the surface potential of the voltage supporting region stable. To allow the conductors 160, 170, 180, and 190 to connect to predetermined portions of the overvoltage protection diode 150, a connection region Bc exists as illustrated in FIG. 14.

CITATION LIST

Patent Literature

Patent Literature 1: International Publication No. WO2014/142331

SUMMARY OF INVENTION

Technical Problem

As described above, the conventional overvoltage protection diode 150 is provided so as to protrude from a side portion to the center portion the semiconductor substrate 120. Therefore, there is a problem that the connection region Bc is large, and the active region A is small accordingly.

In view of the above, an object of the present invention is to provide a semiconductor device in which the active region can be enlarged.

Solution to Problem

A semiconductor device according to the present invention is a semiconductor device in which main electric current flows between one main surface and another main surface of a semiconductor substrate.

The one main surface of the semiconductor substrate is provided with an active region on which the main electric current flows, and a voltage supporting region surrounding the active region and including a periphery of the semiconductor substrate.

The semiconductor device includes an overvoltage protection diode in which an N-type semiconductor layer and a P-type semiconductor layer, formed on an insulating film in the voltage supporting region, are alternately disposed adjacently to each other.

The overvoltage protection diode is disposed at a corner portion on an upper face of the insulating film formed on the semiconductor substrate, and extends from the corner portion toward a center portion of the semiconductor substrate.

Further, in the semiconductor device,
a lateral width of each of the N-type semiconductor layer and the P-type semiconductor layer may be constant.

Further, in the semiconductor device,
the N-type semiconductor layer and the P-type semiconductor layer may each be formed in an arcuate shape or a multistage shape in plan view.

Further, in the semiconductor device,
a lateral width of each of the N-type semiconductor layer and the P-type semiconductor layer may be increased toward the center portion.

Further, in the semiconductor device,
the overvoltage protection diode may be formed in a trapezoidal shape or an arcuate shape in plan view.

Further, in the semiconductor device,
a vertical width of at least one of the N-type semiconductor layer and the P-type semiconductor layer may be decreased toward the center portion.

Further, in the semiconductor device,
a layer thickness of each of the N-type semiconductor layer and the P-type semiconductor layer may be decreased toward the center portion.

Further, in the semiconductor device,
carrier concentration of each of the N-type semiconductor layer and the P-type semiconductor layer may be decreased toward the center portion.

Further, in the semiconductor device,
a side edge of the overvoltage protection diode may be formed in a stepped state, and
a side face in an extending direction of the overvoltage protection diode and a boundary between the N-type semiconductor layer and the P-type semiconductor layer may cross substantially orthogonal to each other.

Further, in the semiconductor device,
a lateral width of each of the N-type semiconductor layer and the P-type semiconductor layer may be decreased toward the center portion.

Further, in the semiconductor device,
the overvoltage protection diode may be formed in an arcuate shape or a multistage shape in plan view.

Further, in the semiconductor device,
a vertical width of at least one of the N-type semiconductor layer and the P-type semiconductor layer may be increased toward the center portion.

Further, in the semiconductor device,
a layer thickness of each of the N-type semiconductor layer and the P-type semiconductor layer may be increased toward the center portion.

Further, in the semiconductor device,
carrier concentration of each of the N-type semiconductor layer and the P-type semiconductor layer may be increased toward the center portion.

Further, in the semiconductor device, a side edge of the overvoltage protection diode may be formed in a stepped state, and a side face in an extending direction of the overvoltage protection diode and a boundary between the N-type semiconductor layer and the P-type semiconductor layer may cross substantially orthogonal to each other.

Further, in the semiconductor device, the insulating film may be provided with a groove extending in a direction orthogonal to an extending direction of the overvoltage protection diode, one of the P-type semiconductor layer and the N-type semiconductor layer may be formed on a bottom face of the groove, and another of the P-type semiconductor layer and the N-type semiconductor layer may be formed on a slant face of the groove.

Further, the semiconductor device may further include one or more conductors formed on the insulating film and electrically connected with the overvoltage protection diode.

Further, the semiconductor device may further include at least one diffusion layer selectively formed on the one main surface of the voltage supporting region and surrounding the active region, and a boundary between the N-type semiconductor layer and the P-type semiconductor layer may be provided along a boundary outside the diffusion layer in plan view.

Advantageous Effect of Invention

In the present invention, the overvoltage protection diode is disposed at a corner portion on the upper face of the insulating film formed on the semiconductor substrate, and extends from the corner portion toward center portion of the semiconductor substrate. Thereby, according to the present invention, the active region can be enlarged.

BRIEF DESCRIPTION OF DRAWINGS

FIG. 9 is a plan view of a semiconductor device 1D according to a modification of the second embodiment.

FIG. 15 FIGS. 15A and 15B are a plan view for comparing the areas of connection regions Bc between the semiconductor device 1 according to the first embodiment and the conventional semiconductor device 100.

FIG. 16 is a plan view of an overvoltage protection diode 5 according to another modification of the third embodiment.

FIG. 17 is a plan view of the overvoltage protection diode 5 according to still another modification of the third embodiment.

DESCRIPTION OF EMBODIMENTS

Figure 1:
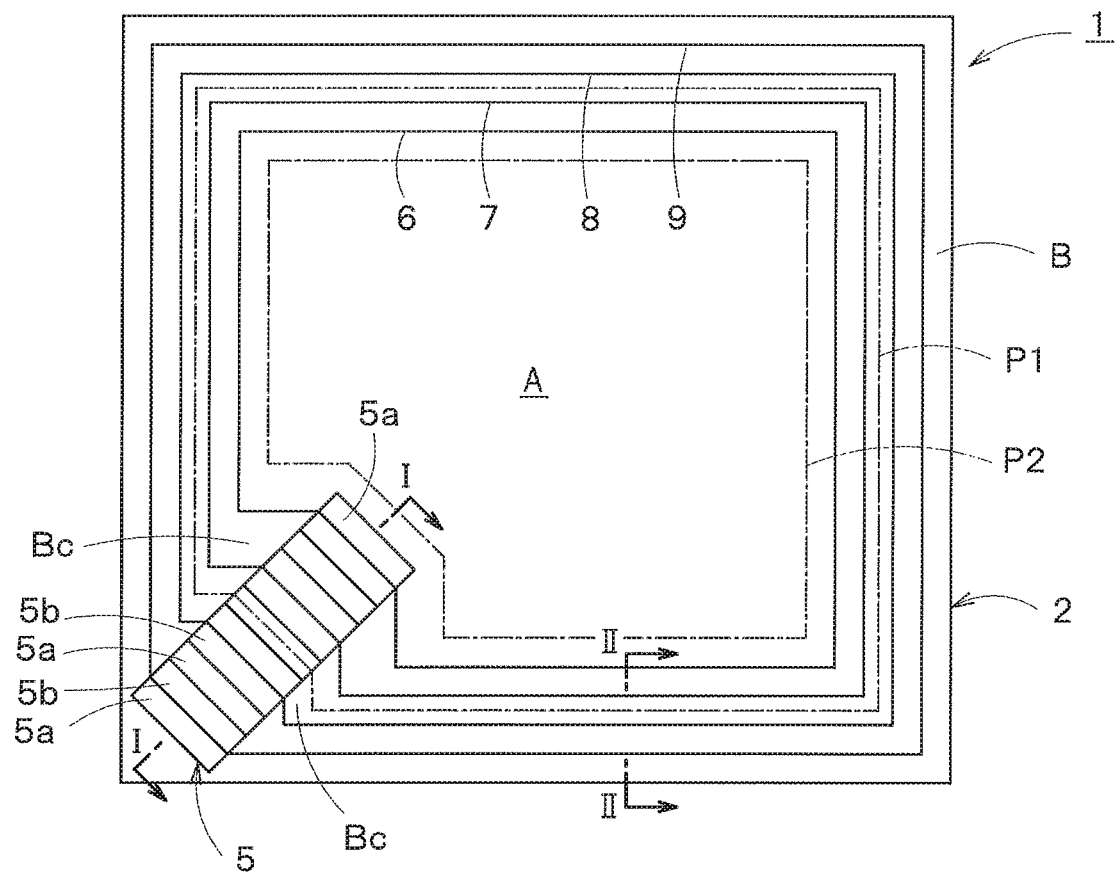
FIG. 1 is a plan view of a semiconductor device 1 according to a first embodiment.

Semiconductor devices according to embodiments of the present invention will be described with reference to the drawings. It should be noted that in the respective drawings, constituent elements having similar functions are denoted by the same reference signs. Further, in the plan views of the semiconductor devices of the respective drawings, shapes of the conductors 6, 7, 8, and 9 and the connection relationships between the conductors 6, 7, 8, and 9 and an overvoltage protection diode 5 are illustrated schematically, and may be different from actual ones.

(First Embodiment)

A semiconductor device 1 according to a first embodiment of the present invention will be described with reference to FIGS. 1 to 3. It should be noted that while FIG. 1 is a plan view of the semiconductor device 1, an insulating film 15, a surface protective film 16, an emitter electrode 21, a gate electrode 22, and a stopper electrode 24 are not illustrated therein.

The semiconductor device 1 according to the first embodiment is an IGBT in which main electric current flows between an upper face 2a (one main surface) and a lower face 2b (the other main surface) of a semiconductor substrate 2. It should be noted that the semiconductor substrate 2 is a silicon substrate in the present embodiment. However, the present invention is not limited to this. It may be another semiconductor substrate (e.g., SiC substrate, GaN substrate, or the like). Further, while the conductive type of the semiconductor substrate 2 is N-type in the present embodiment, it is not limited to this type. In the present embodiment, while the semiconductor substrate 2 is in a substantially square shape in plan view, it is not limited to this shape. The semiconductor substrate 2 may be in a rectangular shape or another shape having corner portions in plan view.

As illustrated in FIG. 1, the upper face 2a of the semiconductor substrate 2 has an active region A where main electric current flows, and a voltage supporting region B surrounding the active region A. The voltage supporting region B includes the periphery of the semiconductor substrate 2. Here, "periphery" means a peripheral portion of the semiconductor substrate 2 including a side face of the semiconductor substrate 2.

Figure 2:
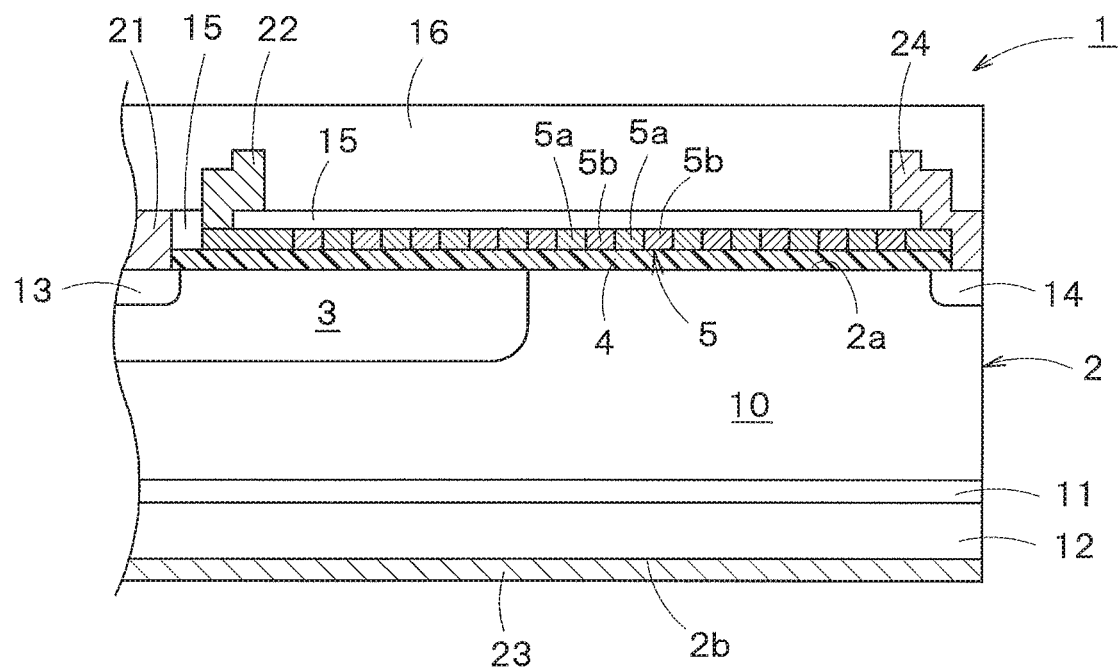
FIG. 2 is a cross sectional view taken along the line I-I of FIG. 1.
Figure 3:
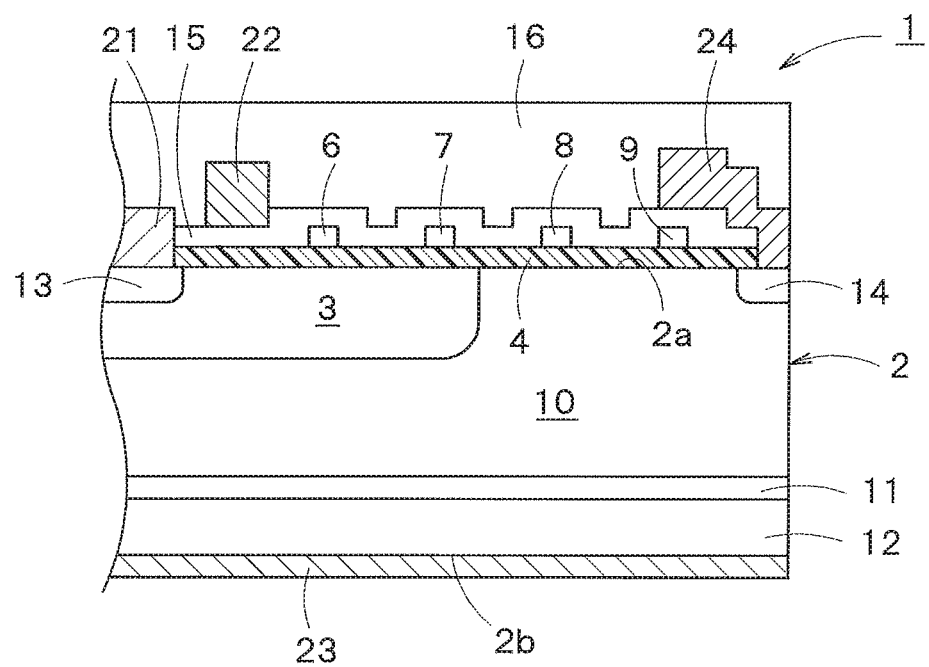
FIG. 3 is a cross sectional view taken along the line II-II of FIG. 1.

As illustrated in FIGS. 1 to 3, the semiconductor device 1 includes a P-type diffusion layer 3, an insulating film 4, an overvoltage protection diode 5, conductors 6, 7, 8, and 9, a P-type collector region 12, an N-type diffusion region 13, an N-type stopper region 14, an emitter electrode 21, a gate electrode 22, a collector electrode 23, and a stopper electrode 24. It should be noted that the upper face 2a of the semiconductor substrate 2 is provided with a gate pad (not shown).

The diffusion layer 3 is selectively formed on the upper face 2a in the voltage supporting region B, surrounding the active region A. The diffusion layer 3 is also called as a P-type base region. It should be noted that the region surrounded by boundaries P1 and P2 in FIG. 1 is the P-type base region. In this example, the boundary P1 is a boundary of pn junction between the diffusion layer 3 and a peripheral semiconductor region 10, and the boundary P2 is a boundary between the active region A and the voltage supporting region B. The peripheral semiconductor region 10 is an N-type semiconductor region located outside the diffusion layer 3.

It should be noted that the semiconductor device 1 may further include a P-type diffusion layer (guard ring) provided to surround the diffusion layer 3 so as to have a high breakdown voltage. The guard ring is selectively formed on the upper face 2a in the voltage supporting region B. Further, the number of guard rings is not limited to one and may be two or more.

The impurity concentration of the diffusion layer 3 and the guard ring ranges from $1\times10^{14}$ cm$^{-3}$ to $1\times10^{19}$ cm$^{-3}$, for example. The depth of the diffusion layer 3 and the guard ring ranges from 2 μm to 10 μm, for example. Further, the impurity concentration of the peripheral semiconductor region 10 ranges from $1\times10^{13}$ cm$^{-3}$ to $1\times10^{15}$ cm$^{-3}$, for example.

As illustrated in FIG. 2, the insulating film 4 is formed on the diffusion layer 3 and on the peripheral semiconductor region 10. The insulating film 4 is a field oxide film, for example. In the present embodiment, the insulating film 4 is a silicon oxide film (SiO$_2$ film), and the thickness thereof ranges from 200 nm to 2000 nm, for example.

The overvoltage protection diode 5 is one in which a plurality of Zener diodes are connected in series. Specifically, the overvoltage protection diode 5 is configured such that an N-type semiconductor layer 5a and a P-type semiconductor layer 5b are alternately disposed adjacently to each other. As illustrated in FIG. 2, the N-type semiconductor layer 5a and the P-type semiconductor layer 5b are formed on the insulating film 4 in the voltage supporting region B. The N-type semiconductor layer 5a and the P-type semiconductor layer 5b are a polysilicon layer to which an N-type impurity (such as phosphorus) is introduced and a polysilicon layer to which a P-type impurity (such as boron) is introduced, respectively. In the present embodiment, the overvoltage protection diode 5 is an overvoltage protection diode provided between a collector and a gate of the IGBT. However, it may be an overvoltage protection diode provided between a gate and an emitter of the IGBT.

As illustrated in FIG. 1, the overvoltage protection diode 5 is formed to be in a substantially rectangular shape in plan view. Regarding the rectangular shape, the width or the like of the rectangle is determined so as to secure the ruggedness of the overvoltage protection diode 5.

As described above, in the overvoltage protection diode 5 according to the first embodiment, the lateral width of each of the N-type semiconductor layer 5a and the P-type semiconductor layer 5b is constant. In the present application, the "lateral width" of the (N-type or P-type) semiconductor layer means a length of the semiconductor layer in a direction orthogonal to the extending direction of the overvoltage protection diode 5.

As illustrated in FIG. 1, the overvoltage protection diode 5 is disposed at a corner portion on the upper face of the insulating film 4 formed on the semiconductor substrate 2, and extends from the corner portion toward the center portion of the semiconductor substrate 2. Thereby, the area of the connection region Bc can be reduced and the active region can be enlarged. In this example, in order to allow the conductors 6, 7, 8, and 9 to connect to the overvoltage protection diode 5, the connection region Bc is a region in which intervals between them are set to be wide, as illustrated in FIG. 1.

The conductors 6, 7, 8, and 9 are formed on the insulating film 4 along the voltage supporting region B so as to surround the active region A. As illustrated in FIG. 1, the conductors 6, 7, 8, and 9 are electrically connected to predetermined positions of the overvoltage protection diode 5, respectively. This means that the conductors 6, 7, 8, and 9 each are electrically connected with the semiconductor layer (N-type semiconductor layer 5a or P-type semiconductor layer 5b) of the overvoltage protection diode 5 based on the required voltage. It should be noted that the connected semiconductor layer is a semiconductor layer of the same conductive type as that of the conductor. The conductor may be connected with two or more continuing semiconductor layers.

In the present embodiment, the conductors 6, 7, 8, and 9 are made of a conductive material such as polysilicon or aluminum, and are arranged in parallel with each other. As illustrated in FIG. 3, the conductors 6 and 7 are arranged above the diffusion layer 3 via the insulating film 4, and the conductors 8 and 9 are arranged above the peripheral semiconductor region 10 via the insulating film 4. It should be noted that the number of conductors is not limited to four, and may be any number (may be one to three, or five or more).

As illustrated in FIG. 2, the diffusion region 13 is an N-type semiconductor region formed in the diffusion layer 3. On the diffusion region 13, the emitter electrode 21 is formed. It should be noted that the impurity concentration of the diffusion region 13 ranges from $1\times10^{19}$ cm$^{-3}$ to $1\times10^{21}$ cm$^{-3}$, for example.

The N-type stopper region 14 is formed on the upper face 2a at a side edge of the semiconductor substrate 2. The impurity concentration of the stopper region 14 is higher than that of the peripheral semiconductor region 10. On the stopper region 14, the stopper electrode 24 is formed. The stopper electrode 24 is electrically connected with another end (right end in FIG. 2) of the overvoltage protection diode 5.

The gate electrode 22 is provided above the diffusion layer 3 via the insulating film 4. In the present embodiment, the gate electrode 22 is formed on the overvoltage protection diode 5. In more detail, as illustrated in FIG. 2, the gate electrode 22 is electrically connected with one end (left end in FIG. 2) on the active region A side of the overvoltage protection diode 5.

The P-type collector region 12 is formed on the lower face 2b of the semiconductor substrate 2. The impurity concentration of the collector region 12 ranges from $1\times10^{17}$ cm$^{-3}$ to $1\times10^{19}$ cm$^{-3}$, for example. As illustrated in FIG. 2, the collector electrode 23 is formed on the collector region 12. It should be noted that an N-type buffer region 11 may be provided adjacent to the collector region 12. The impurity concentration of the buffer region 11 ranges from $1\times10^{16}$ cm$^{-3}$ to $1\times10^{18}$ cm$^{-3}$, for example.

Further, as illustrated in FIG. 2, the semiconductor device 1 also includes an insulating film 15 covering the overvoltage protection diode 5, and a surface protective film 16 covering the entire upper face 2a side of the semiconductor device 1. The insulating film 15 is a BPSG (Boron Phosphorous Silicate Glass) film, for example, and the surface protective film 16 is a polyimide film or a silicon nitride film, for example.

Figure 15A:
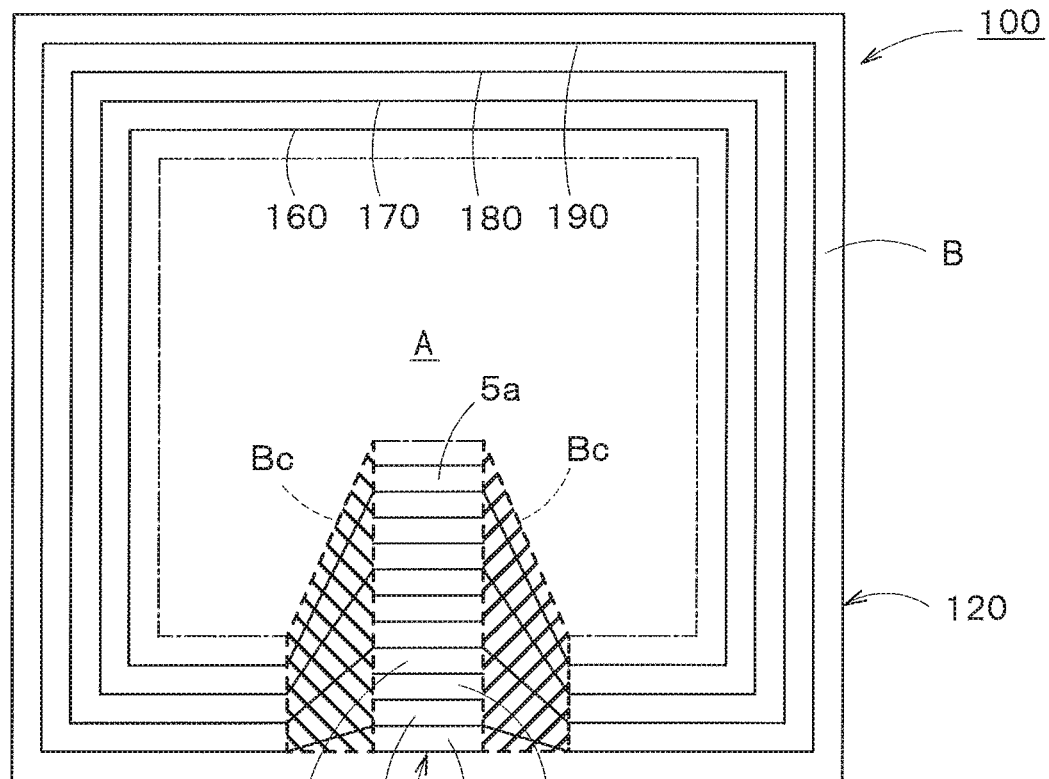
Figure 15B:
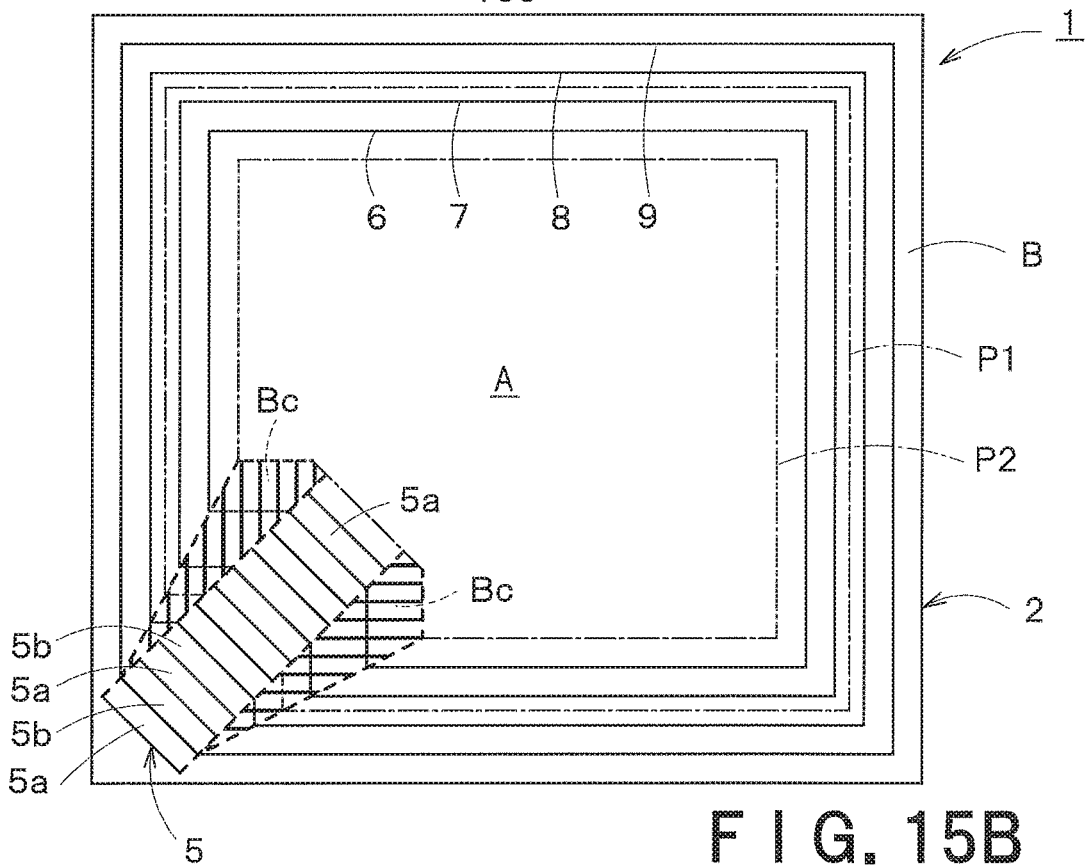

As described above, in the semiconductor device 1 according to the present embodiment, the overvoltage protection diode 5 is disposed at a corner portion of the insulating film 4 formed on the semiconductor substrate 2, and the overvoltage protection diode 5 is formed to extend from the corner portion to the center portion of the semiconductor substrate 2. By disposing the overvoltage protection diode 5 at a corner portion obliquely to a side of the semiconductor substrate 2 in this way, the active region A can be enlarged. As illustrated in FIGS. 15A and 15B, according to the semiconductor device 1, the area of the connection region Bc is significantly reduced compared with that of the conventional semiconductor device 100.

Further, in the semiconductor device 1 according to the present embodiment, the overvoltage protection diode 5 is formed almost symmetrically with respect to the center of the semiconductor substrate 2. As such, in the case of providing a guard ring surrounding the diffusion layer 3 in the peripheral semiconductor region 10, breakdown voltage design of the semiconductor device 1 can be made easily.

It should be noted that the configuration of the IGBT is not limited to that of the semiconductor device 1 described above. For example, a semiconductor device according to a modification may have an N-type drain region instead of the P-type collector region 12, and include a collector electrode 23 that forms a Schottky barrier with the drain region. In that case, the collector electrode 23 is formed of a barrier metal made of platinum or molybdenum.

Further, the conductive type of each respective semiconductor region of the semiconductor device 1 may be opposite to that described above. That is, the diffusion layer 3 may be of N-type, and the peripheral semiconductor region 10 may be of P-type. Moreover, the conductors 6, 7, 8, and 9 may be omitted according to the required reliability or the like.

(Modification of First Embodiment)

Figure 4A:
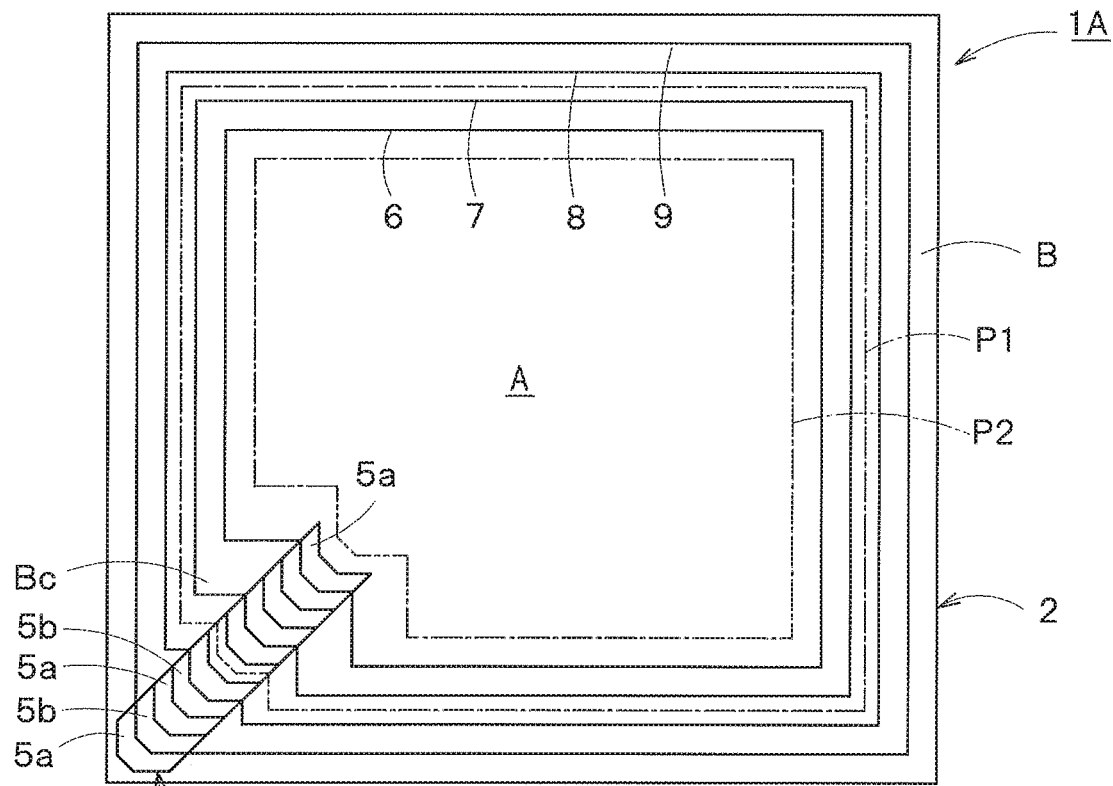
FIG. 4A is a plan view of a semiconductor device 1A according to a modification of the first embodiment.
Figure 4B:
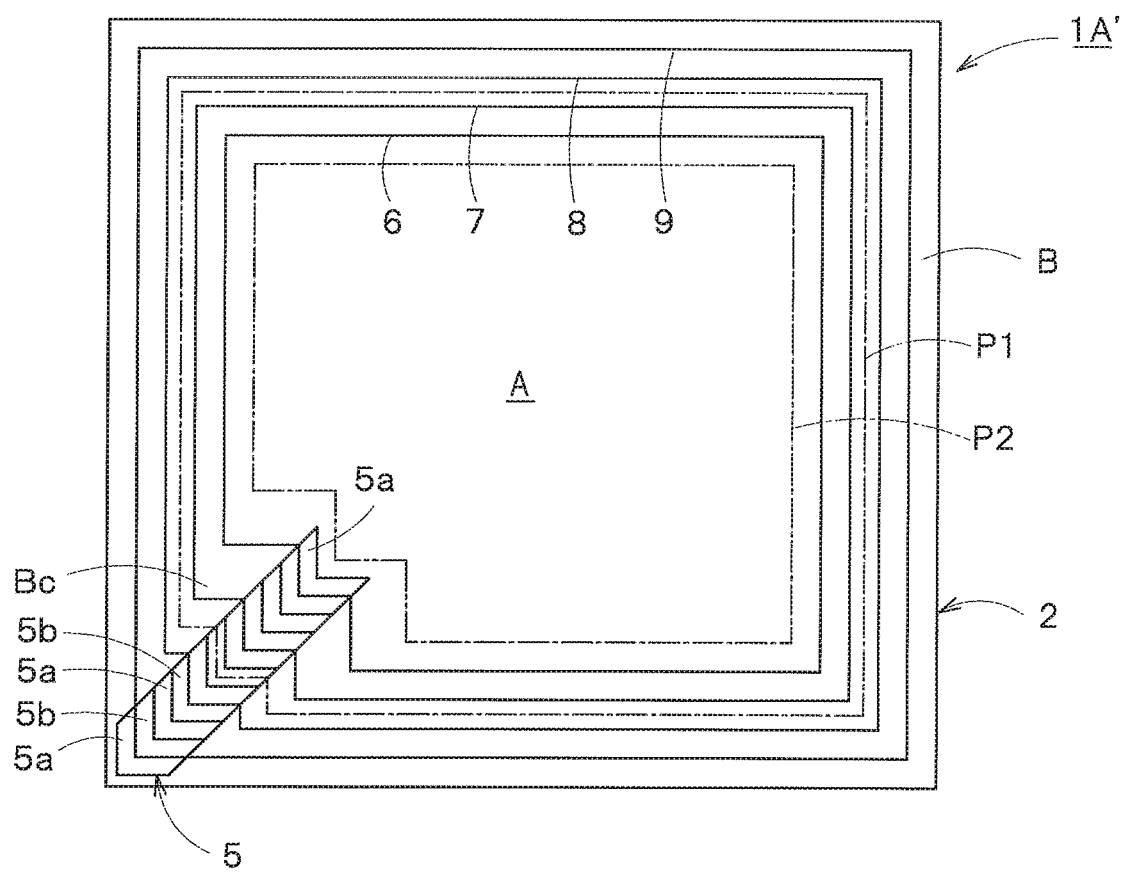
FIG. 4B is a plan view of a semiconductor device 1A' according to a modification of the first embodiment.
Figure 5:
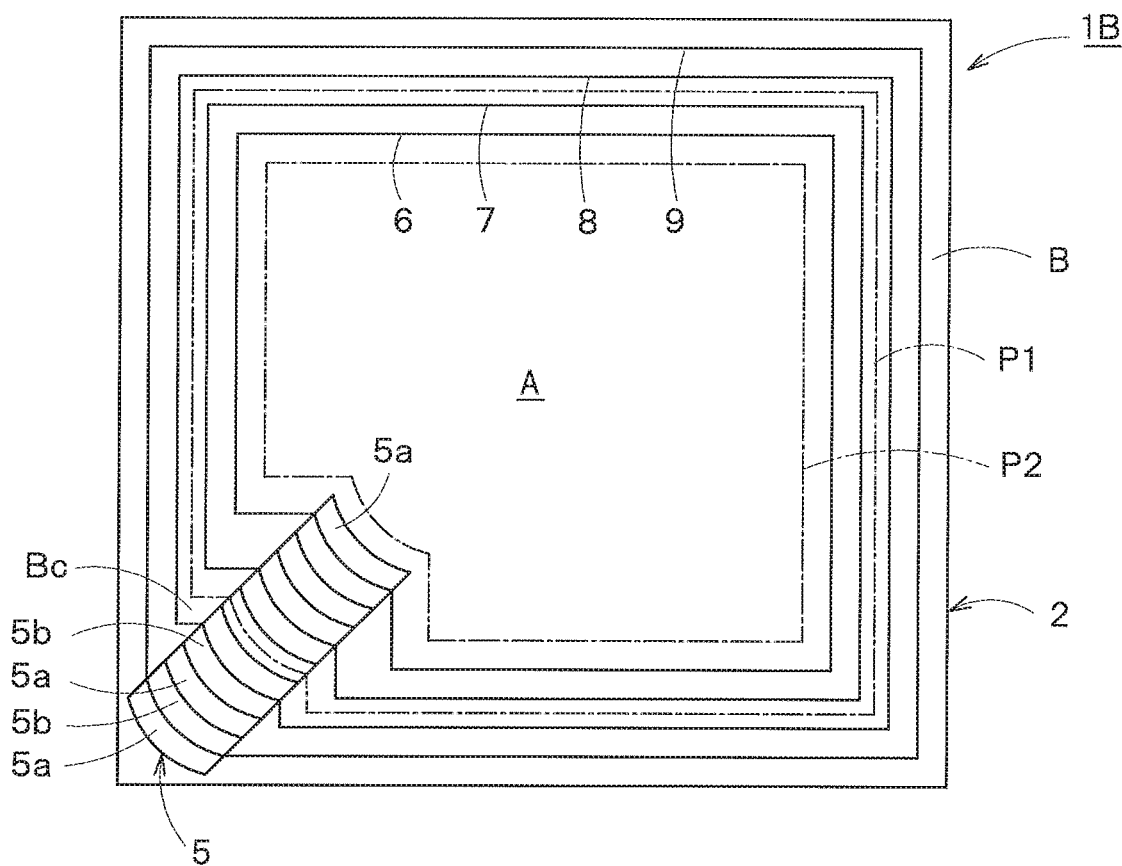
FIG. 5 is a plan view of a semiconductor device 1B according to a modification of the first embodiment.

The planar shape of the N-type semiconductor layer 5a and the P-type semiconductor layer 5b is not limited to a rectangular shape. FIG. 4A shows a plan view of a semiconductor device 1A according to a modification 1 of the first embodiment. FIG. 4B shows a plan view of a semiconductor device 1A' according to a modification 1' of the first embodiment. FIG. 5 shows a plan view of a semiconductor device 1B according to a modification 2 of the first embodiment. As illustrated in FIG. 4A, in the semiconductor device 1A, the N-type semiconductor layer 5a and the P-type semiconductor layer 5b are each formed in three stages in plan view. It should be noted that the N-type semiconductor layer 5a and the P-type semiconductor layer 5b may be formed in two stages (protruding L shape at a corner side) in plan view as illustrated in FIG. 4B, or may be formed in four or more stages. In this way, the N-type semiconductor layer 5a and the P-type semiconductor layer 5b may be formed in multiple stages in plan view.

In the semiconductor device 1B, the N-type semiconductor layer 5a and the P-type semiconductor layer 5b are each formed in a protruding arcuate shape at a corner side in plan view. Even with such a semiconductor device 1A or 1B, an effect similar to that of the semiconductor device 1 can be achieved. Moreover, in the case of the semiconductor device 1B, as the semiconductor layers 5a and 5b are each in an arcuate shape, it is possible to prevent the voltage applied to the overvoltage protection diode 5 from being concentrated locally.

(Second Embodiment)

Next, a semiconductor device 1C according to a second embodiment of the present invention will be described. A difference between the second embodiment and the first embodiment is that the lateral width of each of the N-type semiconductor layer 5a and the P-type semiconductor layer 5b is increased toward the center portion. Hereinafter, the second embodiment will be described focusing on the difference from the first embodiment.

Figure 6:
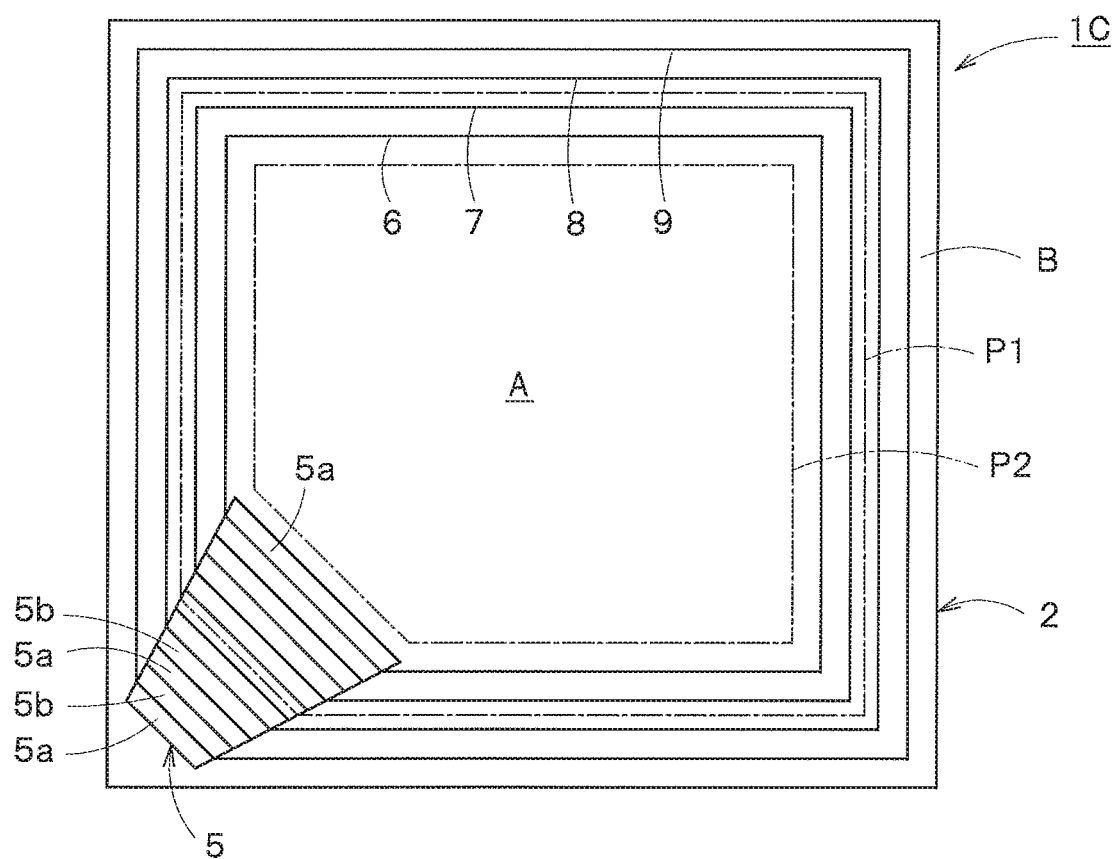
FIG. 6 is a plan view of a semiconductor device 1C according to a second embodiment.

As illustrated in FIG. 6, in the semiconductor device 1C according to the second embodiment, the overvoltage protection diode 5 is formed in a trapezoidal shape in plan view. In more detail, the overvoltage protection diode 5 is formed in a trapezoidal shape in which a side of the active region A side is longer than a side of a corner side of the semiconductor substrate 2 in plan view. This means that the lateral width of each of the N-type semiconductor layer 5a and the P-type semiconductor layer 5b is increased toward the center portion. Thereby, there is no connection region Bc existing in the first embodiment, and the active region A can be further enlarged.

Figure 7:
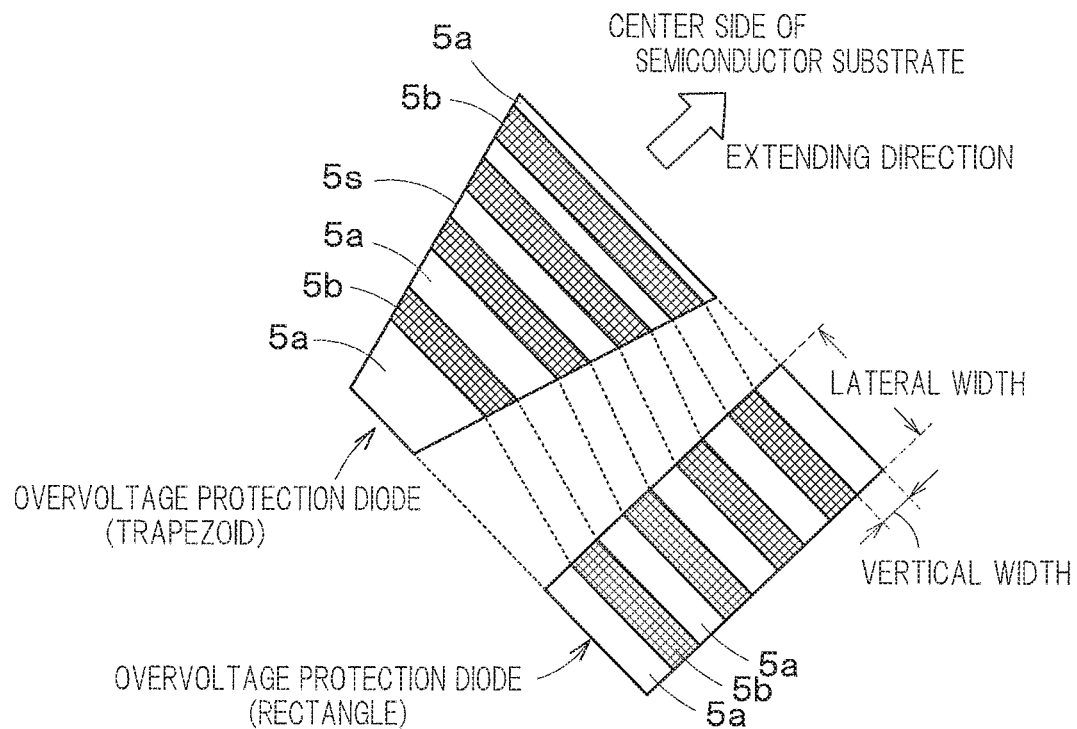
FIG. 7 is a plan view for explaining a detailed configuration of an overvoltage protection diode according to the second embodiment.

A more preferable configuration of the overvoltage protection diode 5 according to the second embodiment will be described with reference to FIG. 7. As illustrated in FIG. 7, the N-type semiconductor layer 5a is configured such that the vertical width thereof is decreased toward the center portion of the semiconductor substrate 2. In the present application, the "vertical width" of the (N-type or P-type) semiconductor layer is a length of the semiconductor layer in the extending direction of the overvoltage protection diode 5. In other words, in the semiconductor layers 5a and 5b having a shorter lateral width, the vertical width is increased. Thereby, as a semiconductor layer having a smaller cross-sectional area has a longer vertical width, the ruggedness of the overvoltage protection diode 5 can be secured sufficiently. Consequently, it is possible to prevent the overvoltage protection diode 5 from being broken permanently at the time of breakdown.

It should be noted that the resistance of the overvoltage protection diode 5 is increased as the vertical width of the semiconductor layer is increased. As such, it is preferable to take the above-described configuration for the N-type semiconductor layer 5a having relatively high carrier concentration, as illustrated in FIG. 7. However, the present invention is not limited to this configuration. That is, the P-type semiconductor layer 5b may be configured such that the vertical width is decreased toward the center portion. Alternatively, both the N-type semiconductor layer 5a and the P-type semiconductor layer 5b may be configured such that the vertical width thereof is decreased toward the center portion.

In order to secure ruggedness of the overvoltage protection diode 5, the N-type semiconductor layer 5a and the P-type semiconductor layer 5b may be formed such that the layer thickness thereof (thickness of the polysilicon layer in the present embodiment) is decreased toward the center portion of the semiconductor substrate 2. In other word, regarding the semiconductor layers 5a and 5b having a narrow lateral width, the thickness is increased. Thereby, the cross-sectional areas of the semiconductor layers 5a and 5b having a narrow lateral width can be secured, which enables the ruggedness of the overvoltage protection diode 5 to be secured sufficiently. Consequently, it is possible to prevent the overvoltage protection diode 5 from being broken permanently at the time of breakdown.

In order to secure ruggedness of the overvoltage protection diode 5, the N-type semiconductor layer 5a and the P-type semiconductor layer 5b may be formed such that the carrier concentration (electron concentration, hole concentration) thereof is decreased toward the center portion of the semiconductor substrate 2. In other words, regarding the semiconductor layers 5a and 5b having a narrow lateral width, the carrier concentration is increased. Thereby, in the semiconductor layers 5a and 5b having a narrow lateral width (that is, small cross-sectional area), the resistance is suppressed low, which enables the ruggedness of the overvoltage protection diode 5 to be secured sufficiently. Consequently, it is possible to prevent the overvoltage protection diode 5 from being broken permanently at the time of breakdown.

It is also possible to secure ruggedness of the overvoltage protection diode 5 by optionally combining control of the vertical width and the layer thickness of the semiconductor layer and the carrier concentration as described above.

It should be noted that in the case where the overvoltage protection diode 5 is in a trapezoidal shape having a side edge 5s as illustrated in FIG. 7, in a state where reverse bias is applied to the semiconductor device 1C, a depletion layer may expand along the bevel side edge 5s whereby punch-through may occur. In this example, a state where reverse bias is applied means a state where the collector electrode 23 is connected to a high potential (e.g., positive electrode of DC power supply), the emitter electrode 21 is connected to a low potential (e.g., earth), and a lower voltage of a level not enough to turn on the IGBT is applied to the gate electrode 22.

Figure 8:
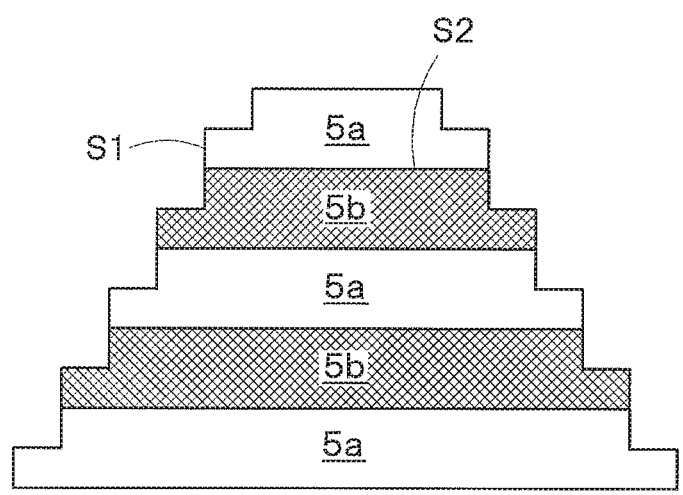
FIG. 8 is a plan view of an overvoltage protection diode having a stepped side edge.

As such, as illustrated in FIG. 8, the side edge 5s of the overvoltage protection diode 5 may be formed in a stepped state, and a side face S1 in the extending direction of the overvoltage protection diode 5 and the boundary S2 between the N-type semiconductor layer 5a and the P-type semiconductor layer 5b may cross substantially orthogonal to each other. Thereby, in a state where reverse bias is applied, the depletion layer expands uniformly from the boundary S2 in the vertical direction, which prevents non-uniform expansion of the depletion layer. Consequently, occurrence of punch-through is suppressed, so that fluctuation of breakdown voltage (that is, Zener voltage) of the overvoltage protection diode 5 can be suppressed.

Further, the planar shape of the overvoltage protection diode 5 is not limited to a trapezoidal shape. For example, like a semiconductor device 1D illustrated in FIG. 9, the overvoltage protection diode 5 may be formed in an arcuate shape in plan view. In that case, it is possible to prevent the voltage applied to the overvoltage protection diode 5 from being concentrated locally. Alternatively, the overvoltage protection diode 5 may be formed in a multistage shape bent at a plurality of positions.

(Third Embodiment)

Next, a semiconductor device 1E according to a third embodiment of the present invention will be described. A difference between the third embodiment and the first embodiment is that the lateral width of each of the N-type semiconductor layer 5a and the P-type semiconductor layer 5b is decreased toward the center portion, which is opposite to the case of the second embodiment. Hereinafter, the third embodiment will be described focusing on the difference from the first embodiment.

Figure 10:
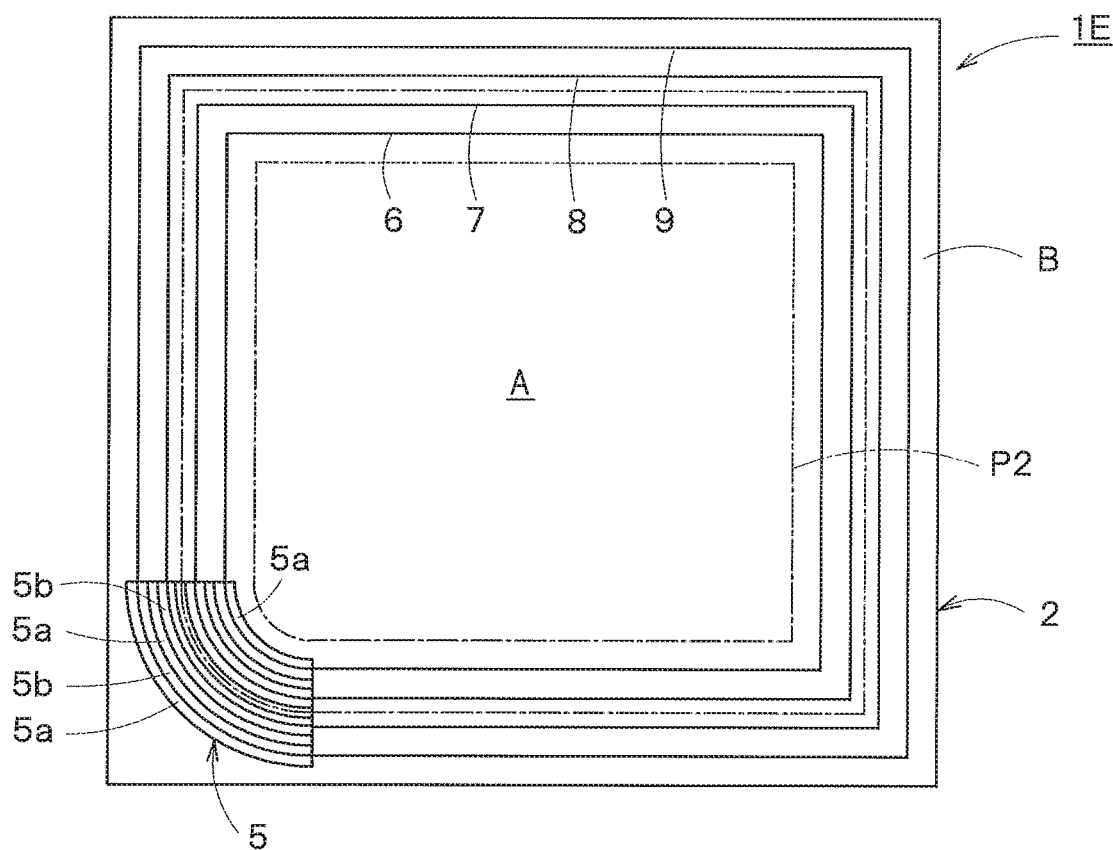
FIG. 10 is a plan view of a semiconductor device 1E according to a third embodiment.

As illustrated in FIG. 10, in the semiconductor device 1E according to the third embodiment, the overvoltage protection diode 5 is formed in an arcuate shape in plan view. In more detail, the overvoltage protection diode 5 is formed such that the lateral width of each of the N-type semiconductor layer 5a and the P-type semiconductor layer 5b is decreased toward the center portion. Thereby, there is no connection region Bc existing in the first embodiment, and the active region A can be further enlarged. Moreover, as each of the semiconductor layers 5a and 5b is in an arcuate shape, it is possible to prevent the voltage applied to the overvoltage protection diode 5 from being concentrated locally.

Figure 11:
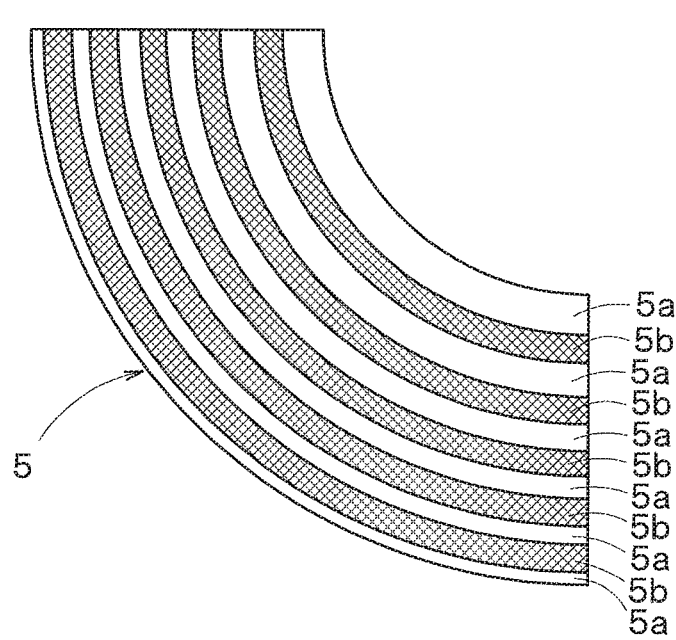
FIG. 11 is a plan view for explaining a detailed configuration of an overvoltage protection diode according to the third embodiment.

A more preferable configuration of the overvoltage protection diode 5 according to the third embodiment will be described with reference to FIG. 11. As illustrated in FIG. 11, the N-type semiconductor layer 5a is configured such that the vertical width thereof is increased toward the center portion of the semiconductor substrate 2. In other words, in the semiconductor layers 5a and 5b having a shorter lateral width (length of the arc), the vertical width is increased. Thereby, as a semiconductor layer having a smaller cross-sectional area has a longer vertical width, the ruggedness of the overvoltage protection diode 5 can be secured sufficiently. Consequently, it is possible to prevent the overvoltage protection diode 5 in which a plurality of Zener diodes are connected in series, from being broken permanently at the time of breakdown.

It should be noted that the resistance of the overvoltage protection diode 5 is increased as the vertical width of the semiconductor layer is increased. As such, as illustrated in FIG. 11, it is preferable to take the above-described configuration for the N-type semiconductor layer 5a having a relatively high carrier concentration. However, the present invention is not limited to this configuration. That is, the P-type semiconductor layer 5b may be configured such that the vertical width is increased toward the center portion. Alternatively, both the N-type semiconductor layer 5a and the P-type semiconductor layer 5b may be configured such that the vertical width thereof is increased toward the center portion.

In order to secure ruggedness of the overvoltage protection diode 5, the N-type semiconductor layer 5a and the P-type semiconductor layer 5b may be formed such that the layer thickness thereof (thickness of the polysilicon layer in the present embodiment) is increased toward the center portion of the semiconductor substrate 2. In other word, regarding the semiconductor layers 5a and 5b having a narrow lateral width, the thickness is increased. Thereby, the cross-sectional areas of the semiconductor layers 5a and 5b having a narrow lateral width can be secured, which enables the ruggedness of the overvoltage protection diode 5 to be secured sufficiently. Consequently, it is possible to prevent the overvoltage protection diode 5 from being broken permanently at the time of breakdown.

In order to secure ruggedness of the overvoltage protection diode 5, the N-type semiconductor layer 5a and the P-type semiconductor layer 5b may be formed such that the carrier concentration (electron concentration, hole concentration) thereof is increased toward the center portion of the semiconductor substrate 2. In other words, regarding the semiconductor layers 5a and 5b having a narrow lateral width, the carrier concentration is increased. Thereby, in the semiconductor layers 5a and 5b having a narrow lateral width (that is, smaller cross-sectional area), the resistance is suppressed low, which enables the ruggedness of the overvoltage protection diode 5 to be secured sufficiently. Consequently, it is possible to prevent the overvoltage protection diode 5 from being broken permanently at the time of breakdown.

It is also possible to secure ruggedness of the overvoltage protection diode 5 by optionally combining control of the vertical width and the layer thickness of the semiconductor layer and the carrier concentration as described above.

Figure 12:
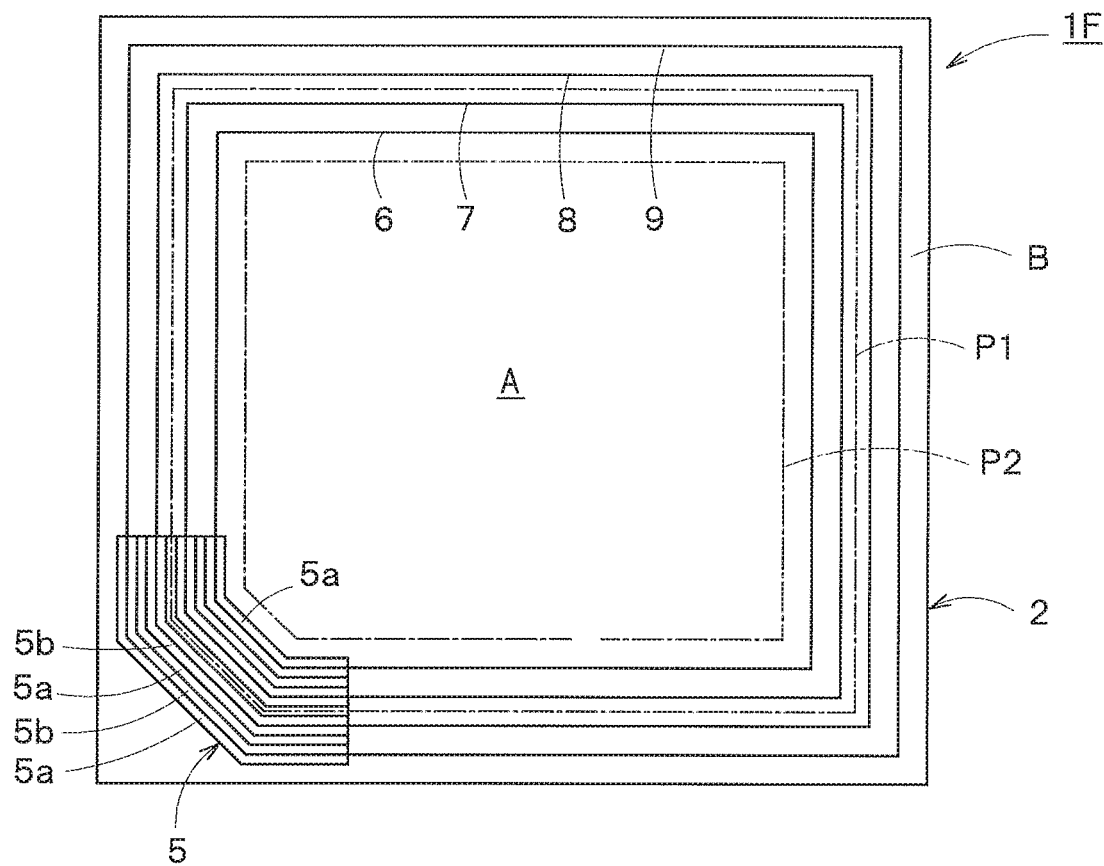
FIG. 12 is a plan view of a semiconductor device 1F according to a modification of the third embodiment.

It should be noted that the overvoltage protection diode 5 according to the third embodiment is not limited to have an arcuate shape. For example, like a semiconductor device 1F illustrated in FIG. 12, the overvoltage protection diode 5 may be formed in a multistage shape bent at a plurality of positions in plan view. In FIG. 12, the overvoltage protection diode 5 is in a three-stage bent shape bent at two positions. However, it is not limited to this, and may be in a bent shape of four or more stages bent at three or more positions.

Further, the overvoltage protection diode 5 may be formed in a trapezoidal shape in plan view. In more detail, the overvoltage protection diode 5 may be formed in a trapezoidal shape in which a side of the active region A side is shorter than a side of a corner side of the semiconductor substrate 2 in plan view.

Further, as illustrated in FIG. 16, the overvoltage protection diode 5 according to the third embodiment may be in a fan shape.

Further, as illustrated in FIG. 17, a side edge of overvoltage protection diode 5 may be in a stepped state, similar to the case described in the second embodiment with reference to FIG. 8. Thereby, in a state where reverse bias is applied, non-uniform expansion of the depletion layer can be prevented. Consequently, occurrence of punch-through is suppressed, so that fluctuation of breakdown voltage of the overvoltage protection diode 5 can be suppressed.

Figure 13:
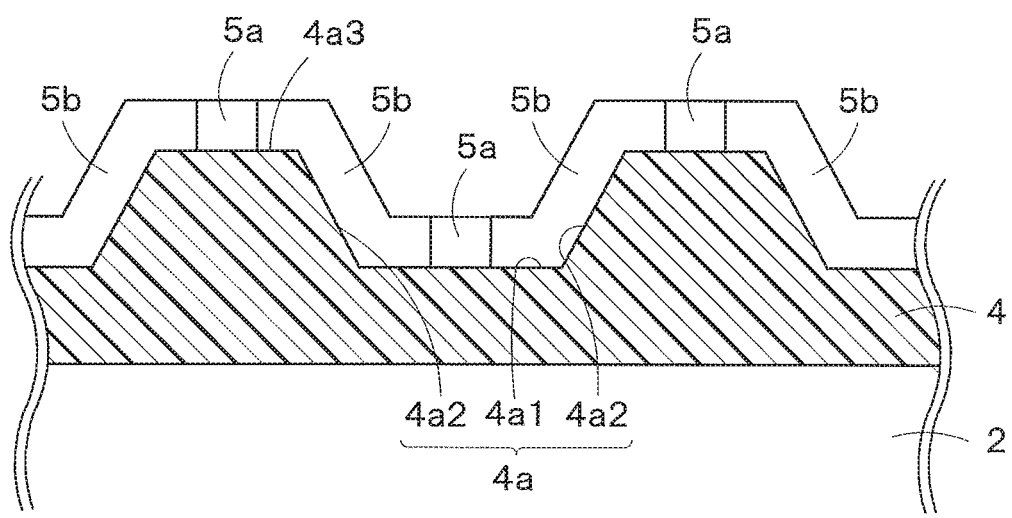
FIG. 13 is a partial cross sectional view of a semiconductor device having a configuration that a groove 4a is formed in an insulating film 4.
Figure 14:
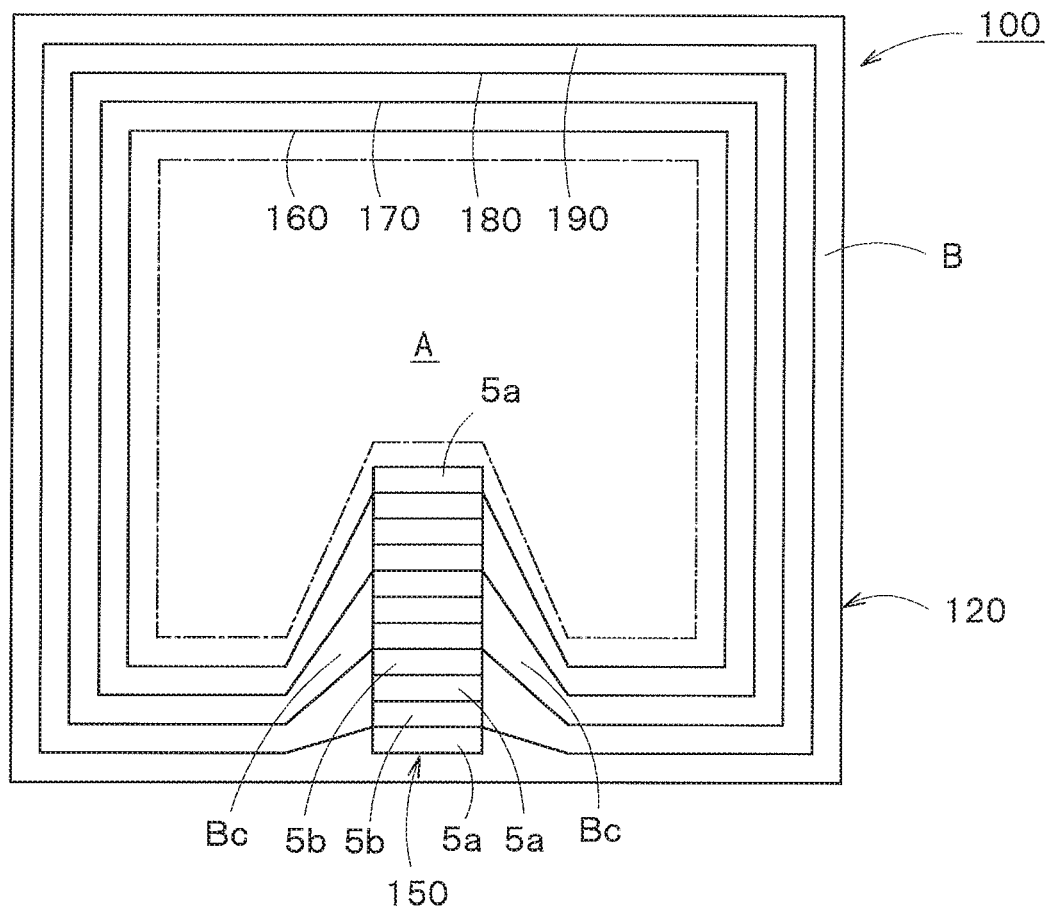
FIG. 14 is a plan view of a conventional semiconductor device 100.

Three embodiments according to the present invention have been described above. As described with reference to FIGS. 7 and 11, there is a case where the vertical width of the semiconductor layer is increased. In that case, as illustrated in FIG. 13, it is possible to form a groove 4a in the insulating film 4 and use the slant face of the groove 4a. Thereby, the plane area occupied by the overvoltage protection diode 5 can be reduced.

In more detail, as illustrated in FIG. 13, the insulating film 4 is provided with the groove 4a extending in a direction (lateral direction) orthogonal to the extending direction of the overvoltage protection diode 5. Then, the N-type semiconductor layer 5a is formed on the bottom face 4a1 of the groove 4a, and the P-type semiconductor layer 5b is formed on the slant face 4a2 of the groove 4a. The N-type semiconductor layer 5a is also provided on the insulating film 4 between the grooves 4a. The P-type semiconductor layer 5b has lower carrier concentration than that of the N-type semiconductor layer 5a, and needs a larger vertical width than that of the N-type semiconductor layer 5a. Accordingly, it is preferable that the P-type semiconductor layer 5b be disposed on the slant face 4a2 of the groove 4a. It should be noted that the N-type semiconductor layer 5a and the P-type semiconductor layer 5b may be replaced with each other. That is to say, the N-type semiconductor layer 5a may be formed on the slant face 4a2 of the groove 4a, and the P-type semiconductor layer 5b may be formed on the bottom face 4a1 of the groove 4a and on the insulating film 4 between the grooves 4a. It should be noted that the configuration of forming an N-type or P-type semiconductor layer on the slant face of the groove 4a is applicable to any overvoltage protection diode 5 described above.

It should be noted that the overvoltage protection diode of the present invention may take any of various planar shapes. Even in the case of any planar shape, it is preferable that the boundary between the N-type semiconductor layer 5a and the P-type semiconductor layer 5b be provided along the boundary (namely, boundary P1) outside the diffusion layer 3 in plan view, as illustrated in the above-described plan views (FIGS. 1, 4, 5, 6, 9, 10, and 12). Thereby, it is possible to mitigate local concentration of the voltage applied to the overvoltage protection diode. For example, as illustrated in FIG. 5, it is preferable that the boundary (arcuate line) between the N-type semiconductor layer 5a and the P-type semiconductor layer 5b be in the same shape as that of the boundary P1 and/or boundary P2. Further, the boundary between the N-type semiconductor layer 5a and the P-type semiconductor layer 5b may be provided along the boundary of the voltage supporting portion of the stopper electrode 24 or the like. Further, in the case where at least one P-type diffusion layer (guard ring) is provided to surround the diffusion layer 3, it is preferable that the boundary between the N-type semiconductor layer 5a and the P-type semiconductor layer 5b be provided along the boundary outside the diffusion layer.

While description has been given on the case where a semiconductor device is an IGBT in the embodiments described above, the present invention is not limited to this. The present invention is applicable to another semiconductor device having a MOS structure such as a vertical MOSFET.

While a person skilled in the art may conceive of additional effects or various modifications of the present invention based on the description provided above, the aspects of the present invention are not limited to each of the embodiments described above. Constituent elements of different embodiments may be combined appropriately. Various addition, modification, and partial deletion can be made within a scope not deviating from the conceptual ideas and the purport of the present invention derived from the contents defined in the scope of the claims and the equivalents thereof.

REFERENCE SIGNS LIST 1, 1A, 1B, 1C, 1D, 1E, 1F semiconductor device
2 semiconductor substrate
2a upper face
2b lower face
3 diffusion layer
4 insulating film
4a groove
4a1 bottom face (of groove)
4a2 slant face (of groove)
5 overvoltage protection diode
5a N-type semiconductor layer
5b P-type semiconductor layer
5s side edge
6, 7, 8, 9 conductor
10 peripheral semiconductor region
11 buffer region
12 collector region
13 diffusion region
14 stopper region
15 insulating film
16 surface protective film
21 emitter electrode
22 gate electrode
23 collector electrode
24 stopper electrode
100 semiconductor device
120 semiconductor substrate
150 overvoltage protection diode
160, 170, 180, 190 conductor
A active region
B voltage supporting region Bc connection region
P1, P2 boundary (of diffusion layer 3)
S1 side face (of overvoltage protection diode 5)
S2 boundary (between N-type semiconductor layer 5a and P-type semiconductor layer 5b)

The invention claimed is:

1. A semiconductor device in which main electric current flows between one main surface and another main surface of a semiconductor substrate,
   the one main surface of the semiconductor substrate being provided with an active region on which the main electric current flows and a voltage supporting region surrounding the active region and including a periphery of the semiconductor substrate,
   the semiconductor device comprising an overvoltage protection diode in which an N-type semiconductor layer and a P-type semiconductor layer, formed on an insulating film in the voltage supporting region, are alternately disposed adjacently to each other,
   the overvoltage protection diode being disposed at a corner portion on an upper face of the insulating film formed on the semiconductor substrate, and extending from the corner portion toward a center portion of the semiconductor substrate,
   a lateral width of each of the N-type semiconductor layer and the P-type semiconductor layer is increased toward the center portion.

2. The semiconductor device according to claim 1, wherein
   the overvoltage protection diode is formed in a trapezoidal shape or an arcuate shape in plan view.

* * * * *